United States Patent [19]

Ichihara

[11] Patent Number: 5,798,665
[45] Date of Patent: Aug. 25, 1998

[54] BIAS CONTROLLER FOR DECREASING BIAS CURRENT SUPPLIED TO AMPLIFIER WITHOUT SACRIFICE IF DISTORTION

[75] Inventor: Masaki Ichihara, Tokyo, Japan

[73] Assignee: NEC Corporation, Tokyo, Japan

[21] Appl. No.: 736,505

[22] Filed: Oct. 24, 1996

[30] Foreign Application Priority Data

Oct. 25, 1995  [JP]  Japan .................. 7-276076

[51] Int. Cl.⁶ ........................................ H03K 5/08
[52] U.S. Cl. .................. 327/317; 327/62; 327/362; 327/538
[58] Field of Search ............... 327/317, 551, 327/552, 427, 430, 431, 434, 436, 62, 58, 362, 363, 379, 538

[56] References Cited

U.S. PATENT DOCUMENTS

| | | | |
|---|---|---|---|
| 3,641,414 | 2/1972 | Thompson | 318/662 |
| 4,532,477 | 7/1985 | Green, Jr. et al. | 330/277 |
| 4,987,384 | 1/1991 | Yamanouchi et al. | 330/277 |
| 5,412,692 | 5/1995 | Uchida | 327/58 |
| 5,477,185 | 12/1995 | Jouen | 327/363 |
| 5,483,191 | 1/1996 | Blodgett | 327/362 |

FOREIGN PATENT DOCUMENTS

| | | | |
|---|---|---|---|
| 0359477 | 3/1990 | European Pat. Off. | H03F 1/34 |
| 5-235646 | 9/1993 | Japan | H03F 1/32 |

*Primary Examiner*—Toan Tran
*Attorney, Agent, or Firm*—Sughrue, Mion, Zinn, Macpeak & Seas, PLLC

[57] ABSTRACT

A bias current controlling circuit minimizes the power consumption of a high-frequency power amplifier incorporated in a battery powered portable telephone by controlling a bias current supplied to the high-frequency power amplifier in such a manner that an output signal of the high-frequency power amplifier increases the distortion as large in an allowable range as possible, because the bias current is inversely proportional to the magnitude of the distortion.

12 Claims, 4 Drawing Sheets

1

BIAS CONTROLLER FOR DECREASING BIAS CURRENT SUPPLIED TO AMPLIFIER WITHOUT SACRIFICE IF DISTORTION

FIELD OF THE INVENTION

This invention relates to a bias controller associated with an amplifier and, more particularly, to a bias current controlling circuit for a high-frequency transmitting power amplifier incorporated in a battery powered radio communication device such as, for example a portable telephone.

DESCRIPTION OF THE RELATED ART

A battery powered portable telephone is in great demand. Various kinds of battery powered portable telephones are manufactured, and sold in the market. One of the most important technical aspect of portable telephones is how long the battery allows the portable telephone to communicate with other portable telephones. Another important aspect is the fidelity. An approach to extending operating time is to decrease the bias current supplied to a power amplifier incorporated in the transmitting section of the portable telephone. However, when the bias current is decreased, the power amplifier tends to increase the distortion of the output signal, and the fidelity deteriorates. Thus, there is a trade-off between long operating time and the fidelity, thus, manufacturers can not achieve the long operating time by simply decreasing the bias current.

Japanese Patent Publication of Unexamined Application No. 5-235646 proposes a non-linear distortion compensating circuit 1. FIG. 1 illustrates the non-linear distortion compensating circuit 1 disclosed in the Japanese Patent Publication of Unexamined Application. The prior art nonlinear distortion compensating circuit 1 comprises a nonlinear compensator 1a, a directional coupler 1b, a detector 1c and a bias controlling circuit 1d. An input signal IN1 is supplied to the non-linear compensator 1a, and an output signal OUT1 is taken out from the directional coupler 1b.

In detail, a metal-semiconductor type field effect transistor 1e is incorporated in the non-linear compensator 1a, and is fabricated on a gallium-arsenide substrate. The input signal IN1 is transferred to the gate electrode of the metal-semiconductor type field effect transistor 1e for distorting the input signal IN1, and a distorted signal DS1 is supplied from the non-linear compensator 1a to the directional coupler 1b. The distorted signal DS1 is output through the directional coupler 1b as the output signal OUT1.

The directional coupler 1b branches a sample SA1 from the distorted signal DS1, and the sample SA1 is supplied to the detector 1c. The detector 1c produces a detected signal DT1 from the sample SA1, and the detected signal DT1 has a direct-current voltage representative of the output level of the sample SA1 or the distorted signal DS1.

The detected signal DT1 is supplied to the bias controlling circuit 1d, and the bias controlling circuit 1d is responsive to the detected signal DT1 so as to vary a gate bias voltage of the metal-semiconductor type field effect transistor 1e. When the distorted signal has a small output level, the bias controlling circuit 1d increases the gate bias, and suppresses a distortion of the output signal OUT1. On the other hand, when the distorted signal DS1 has a large output level, the bias controlling circuit 1d decreases the gate bias for a power conservation, because the output signal has increased the margin. Thus, the prior art non-linear distortion compensating circuit 1a, the directional coupler 1b, the detector 1c and the bias controlling circuit 1d form a feedback loop, and the feedback loop varies the bias current depending upon the

2 potential level of the output signal OUT1. The prior art non-linear distortion compensating circuit 1a uses the relation between the bias current and the distortion of the output signal of the metal-semiconductor type field effect transistor, and optimizes the distortion. However, a power conservation is not taken into account, and the prior art distortion compensating circuit 1 does not satisfy power consumption expectations for the portable telephone.

SUMMARY OF THE INVENTION

It is therefore an important object of the present invention to provide a bias current controlling circuit which reduces a bias current without enlargement of a distortion.

To accomplish the object, the present invention proposes to vary a bias current within an acceptable distortion range of an output signal.

In accordance with the present invention, there is provided a bias current controlling circuit for an amplifier comprising: a distortion detecting means for producing a first output signal representative of the magnitude of a distortion contained in a second output signal of the amplifier; and a bias current regulating means responsive to the first output signal so as to regulate a bias current supplied to the amplifier in such a manner as to match the magnitude of the distortion with a target magnitude.

BRIEF DESCRIPTION OF THE DRAWINGS

The features and advantages of the bias current controlling circuit according to the present invention will be more clearly understood from the following description taken in conjunction with the accompanying drawings in which.

DESCRIPTION OF THE PREFERRED EMBODIMENT

Figure 1:
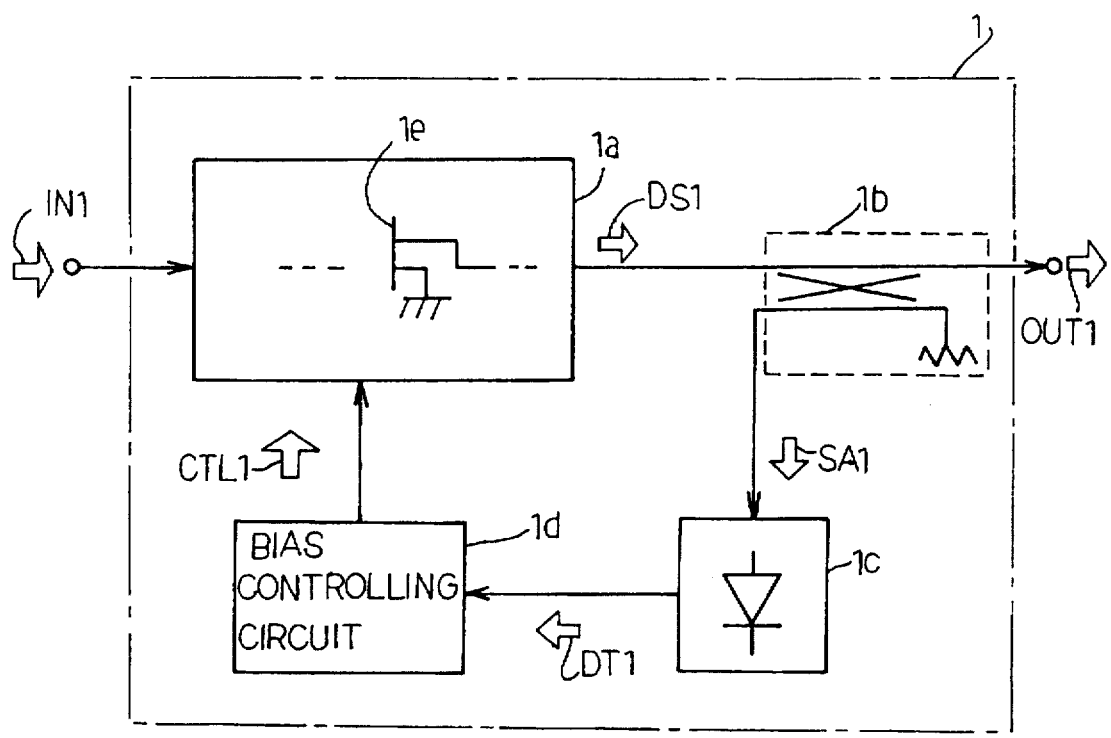
FIG. 1 is a circuit diagram showing the circuit configuration of the prior art non-linear distortion compensating circuit.
Figure 2:
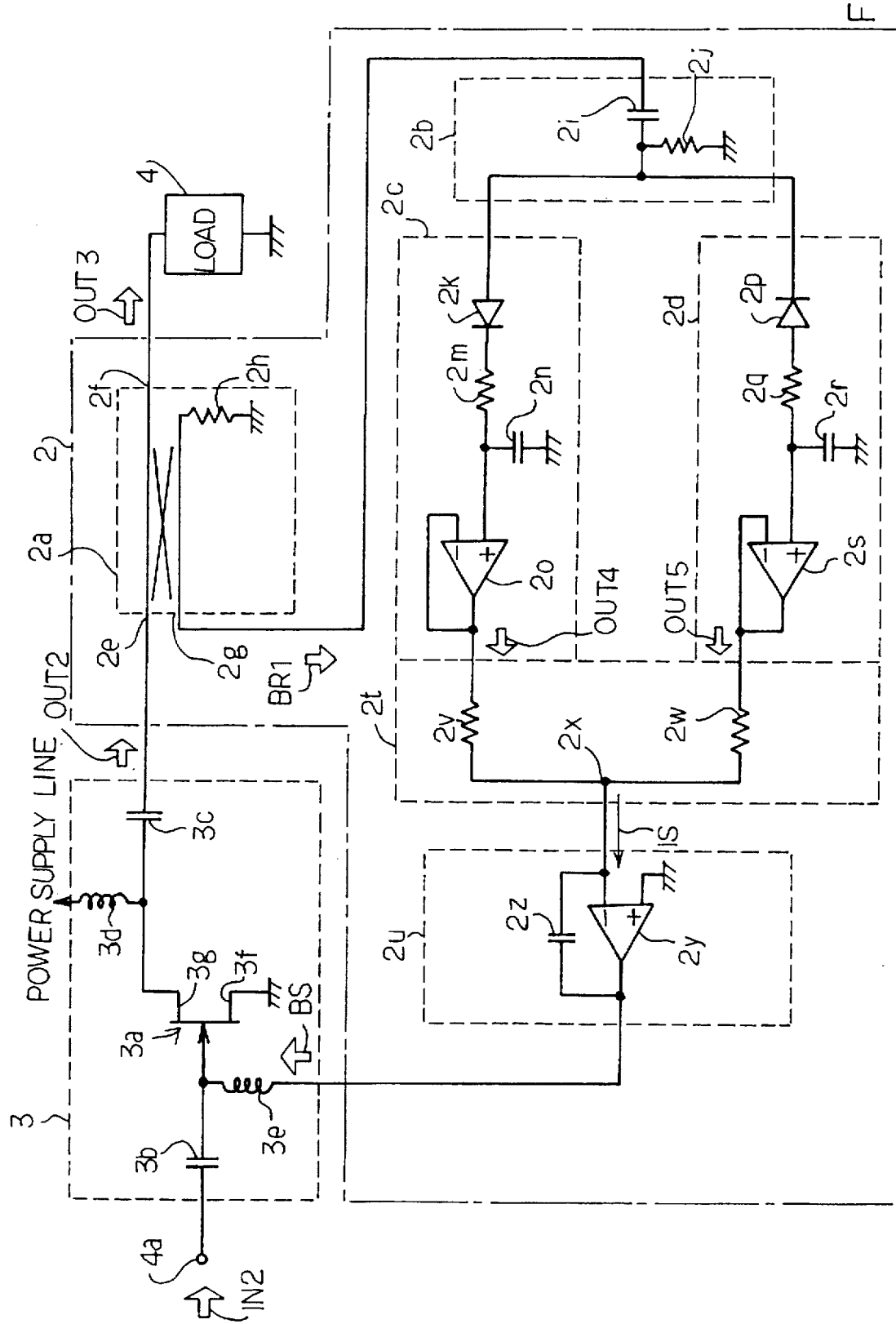
FIG. 2 is a circuit diagram showing the circuit arrangement of a bias current controlling circuit according to the present invention.

Referring to FIG. 2 of the drawings, a bias current controlling circuit 2 embodying the present invention is connected to a high-frequency power amplifier 3, and the high-frequency power amplifier 3 is expected to drive a load 4. The bias current controlling circuit 2, the high-frequency power amplifier 3 and the load 4 form parts of a transmitting section incorporated in a portable telephone.

First, description is made on the high-frequency power amplifier 3. The high-frequency power amplifier 3 includes a metal-semiconductor type field effect transistor 3a, coupling condensers 3b and 3c and choke coils 3d and 3e. The metal-semiconductor type field effect transistor 3a is fabricated on a gallium arsenide substrate (not shown), and the gallium arsenide substrate provides a conduction channel between a source node 3f and a drain node 3g. The coupling condenser 3b is connected between an input terminal 4a and the gate electrode of the metal-semiconductor type field effect transistor 3a, and an input signal IN2 is supplied from the input terminal 4a through the coupling condenser 3b to the gate electrode of the metal-semiconductor type field effect transistor 3a. A bias signal BS is supplied through the choke coil 3e to the gate electrode of the metal-semiconductor type field effect transistor 3a, and changes the bias condition of the metal-semiconductor type field effect transistor 3a.

The metal-semiconductor type field effect transistor 3a is responsive to the input signal IN2 for modulating the channel current, and produces an output signal OUT2. The output signal OUT2 is supplied through the coupling condenser 3c.

The bias current controlling circuit 2 includes a directional coupler 2a, a coupler 2b, a first detector 2c for a positive half-wave and a second detector for a negative half-wave.

The directional coupler 2a has a signal input node 2e coupled to the high-frequency power amplifier 3, a signal output node 2f coupled to the load 4 and a branched signal node 2g coupled to the coupler 2b. The output signal OUT2 is supplied to the signal input node 2e, and the directional coupler 2a produces an output signal OUT3 from the output signal OUT2. The output signal OUT3 is supplied from the signal output node 2f to the load 4. On the other hand, the branched signal output node 2g is grounded through a terminal resistor 2h, and the directional coupler 2a converts part of the energy of the output signal OUT2 to a branched signal BR1. The branched signal BR1 is supplied from the branched signal output node 2g to the coupler 2b.

The coupler 2b has a coupling condenser 2i and a terminal resistor 2j. The branched signal output node 2g is connected to one electrode of the coupling condenser 2i, and the branched signal BR1 is supplied from the directional coupler 2a to the electrode. The other electrode is grounded through the terminal resistor 2j, and is further connected to the first and second detectors 2c and 2d. The branched signal BR1 passes through the coupling condenser 2i, and is distributed to the first and second detectors 2c and 2d.

A detecting diode 2k, a resistor 2m, a smoothing condenser 2n and an operational amplifier 2o form in combination the first detector 2c. Similarly, the second detector 2d is constituted by a detecting diode 2p, a resistor 2q, a smoothing condenser 2r and an operational amplifier 2s. However, the other electrode of the coupling condenser 2i is connected to the anode of the detecting diode 2k and the cathode of the other detecting diode 2p, and, for this reason, the detecting diodes 2k and 2p separate the branched signal BR1 into a positive half-wave and a negative half-wave. The positive half-wave and the negative half-wave are respectively supplied through the resistors 2m and 2q to the smoothing condensers 2o and 2s. The smoothing condensers 2o and 2s receive the positive half-wave and the negative half-wave, respectively.

The smoothing condensers 2n and 2r are coupled to non-inverted input nodes of the operational amplifiers 2o and 2s, respectively, and the inverted nodes of the operational amplifiers 2o and 2s are coupled to the output nodes thereof. The positive half-wave passes through the smoothing condenser 2n, and is supplied to the non-inverted node of the operational amplifier 2o. The operational amplifier 2o generates an output signal OUT4 representative of a positive peak value of the branched signal BR1. Similarly, the negative half-wave passes through the smoothing condenser 2r, and is supplied to the non-inverted node of the operational amplifier 2s. The operational amplifier 2s generates an output signal OUT5 representative of a negative peak value of the branched signal BR1.

The bias current controlling circuit 2 further includes a mixer 2t and a bias current generator 2u. A first resistor 2v and a second resistor 2w constitute the mixer 2t, and the output nodes of the operational amplifiers 2o and 2s are respectively connected to the first and second resistors 2v and 2w. The first resistor 2v and the second resistor 2w are connected to a node 2x, and the output signal OUT4 is merged with the output signal OUT5 at the node 2x.

The bias current generator 2u is implemented by a two-input integrator. In detail, an operational amplifier 2y and an integrating condenser 2z coupled between the inverted node and the output node of the operational amplifier 2y. The non-inverted node of the operational amplifier 2y is grounded, and the operational amplifier 2y supplies the bias signal BS from the output node thereof through the choke coil 3e to the gate electrode of the metal-semiconductor type field effect transistor 3a.

In this instance, the directional coupler 2a, the coupler 2b and the first and second detectors 2c and 2d as a whole constitute a distortion detecting means, and the mixer 2t and the bias current generator 2u form in combination a bias current regulating means.

Figure 3:
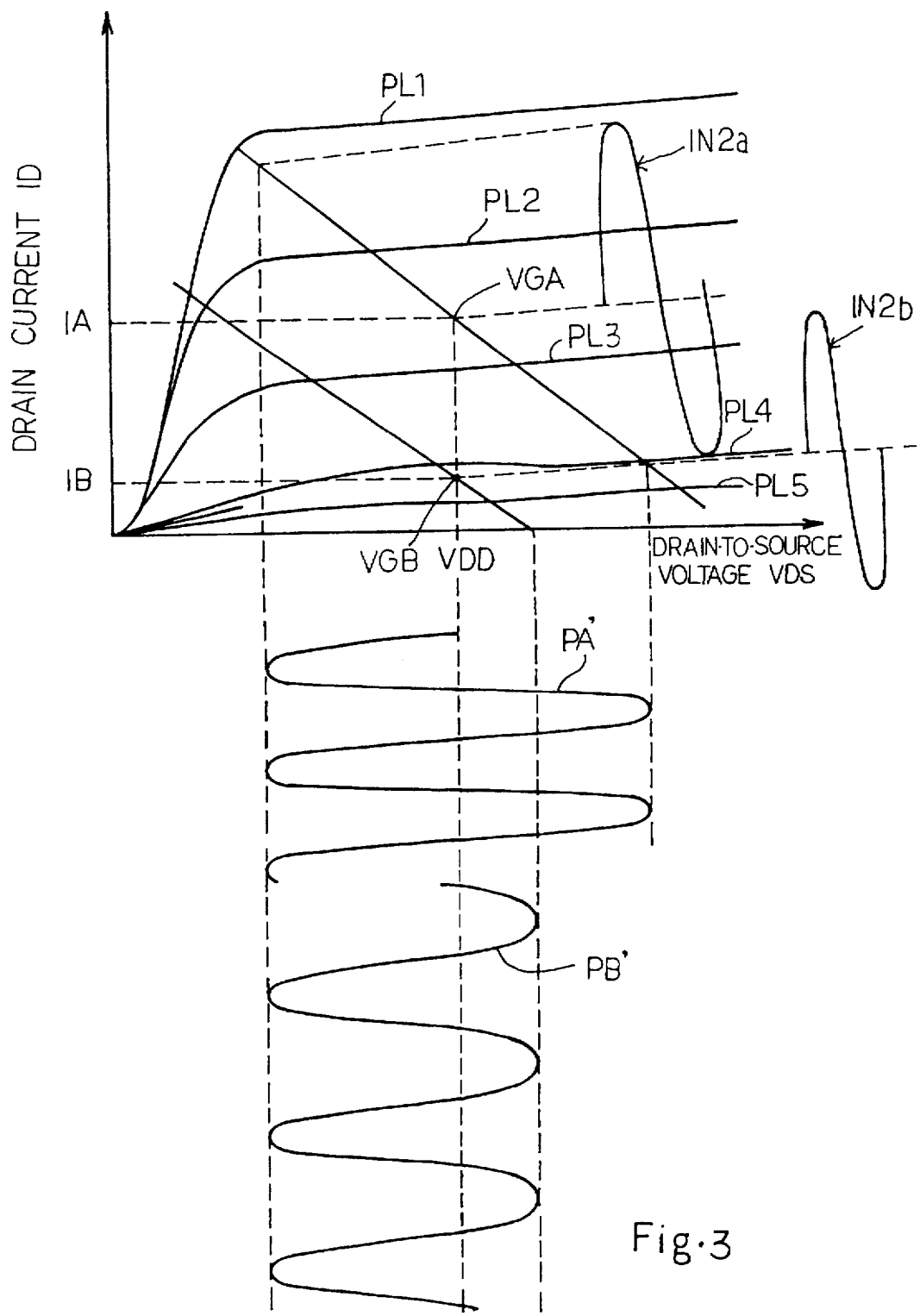
FIG. 3 is a diagram showing the transistor characteristics of a metal-semiconductor type field effect transistor incorporated in a high-frequency power amplifier.

Subsequently, description is made on the transistor characteristics of the metal-semiconductor type field effect transistor 3a. FIG. 3 illustrates the relation between the drain-to-source voltage VDS and the drain current observed in the metal-semiconductor type field effect transistor 3a. When the gate-to-source bias voltage VGS is adjusted to −1.0 volt, −1.5 volts, −2.0 volts, −2.5 volts and −3.0 volts, the drain current ID is varied along PL1, PL2, PL3, PL4 and PL5 in terms of the drain-to-source voltage VDS.

If the bias voltage is regulated to VGA, plots IN2a represents the waveform of the input signal IN2 at the gate electrode of the metal-semiconductor type field effect transistor 3a, and the metal-semiconductor type field effect transistor 3a produces an output waveform represented by plots PA'. Comparing plots IN2a with plots PA', it is understood that the input signal IN2 is less distorted. However, a large amount of direct bias current IA flows.

On the other hand, if the bias voltage is regulated to VGB, an input waveform IN2b results in an output waveform PB'. The input waveform IN2b is widely distorted, however, a small amount of direct bias current IB is consumed.

Thus, this is the trade-off between the distortion of the output waveform and the consumption of the direct bias current. Even if the output signal OUT2 contains the distortion, the distortion is minimal when compared to the increase in fidelity. Therefore, it is necessary to find a target distortion range for the acceptable level-of fidelity. When the acceptable distortion range is determined, the bias current controlling circuit 2 controls the direct bias current in such a manner as to force the distortion as close to the largest value in the target range as possible. This results in power conservation. However, the acceptable fidelity and, accordingly, the target distortion ranges are not identical between different kinds of radio communication device. For this reason, it is an important goal for the manufacturer to develop how to precisely detect the distortion and how to convert the detected distortion into the direct bias current.

Figure 4A:
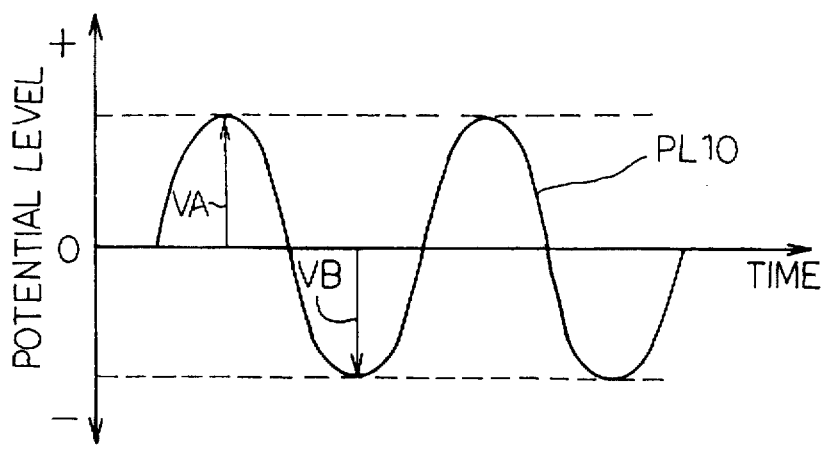
FIGS. 4A to 4C are graphs showing high, middle and low grades of output waveform affected by a distortion.
Figure 4B:
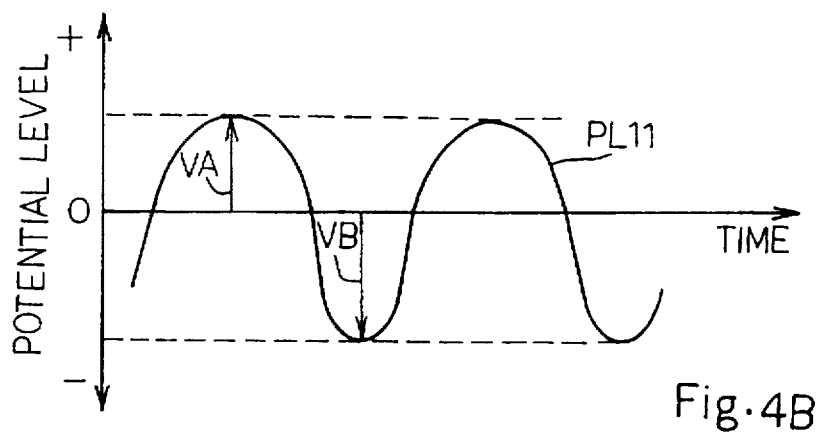
Figure 4C:
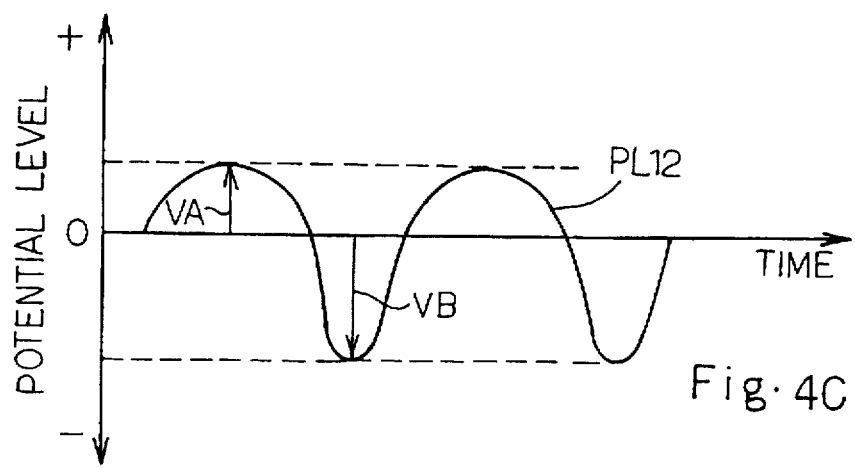

FIGS. 4A to 4C illustrate three kinds of distortion. A high-grade output waveform, a middle-grade output waveform and a low-grade output waveform are represented by plots PL10, PL11 and PL12, respectively. The high-grade waveform PL10 is less affected by a distortion, and the magnitude of the distortion is small. The middle-grade waveform PL11 is somewhat affected by the distortion, and the magnitude of the distortion is larger than that of the high-grade waveform. The distortion seriously affects the low-grade waveform, and the magnitude of the distortion is larger than that of the middle-grade waveform.

The high-grade output waveform has a positive peak value VA and a negative peak value VB, and the ratio of the positive peak value VA to the negative peak value VB is approximately equal to "1". The ratio of the positive peak value VA to the negative peak value VB of the middle-grade output waveform ranges from 0.6 to 0.9. When the distortion seriously affects the output waveform, the ratio of the positive peak value VA to the negative peak value VB is lowered to 0.5 or less. Thus, the distortion is represented by the ratio between the positive value and the negative value, and the first detector 2c and the second detector 2d are incorporated in the bias current controlling circuit 2 so as to determine the positive peak value and the negative peak value. The mixer 2t causes the bias current generator 2u to regulate the positive peak value and the negative peak value to a predetermined ratio corresponding to a target distortion level as follows.

Assuming now that the branched signal BR1 is supplied through the coupler 2b to the first and second detectors 2c and 2d, the smoothing condenser 2n receives the positive half-wave of the branched signal BR1, and the other smoothing condenser 2r receives the negative half-wave of the branched signal BR1.

The smoothing condensers 2n and 2r supply the potential levels representative of the positive peak value and the negative peak value to the associated operational amplifiers 2o and 2s, respectively. The operational amplifiers 2o and 2s produces the output signals OUT4 and OUT5 also representative of the positive peak value and the negative peak value, and the output signals OUT4 and OUT5 are assumed to have potential levels VA and −VB, respectively, where VA and VB are greater than zero.

The output signals OUT4 and OUT5 are mixed by the mixer 2t, and the mixer 2t supplies current IS to the integrating condenser 2z. The amount of current IS is given by equation 1.

$$IS=VA/RA-VB/RB=(RB\times VA-RA\times RB)/(RA\times RB) \qquad \text{Equation 1}$$

where RA and RB are the resistance of the resistor 2v and the resistance of the resistor 2w.

When VA/VB is greater than RA/RB, IS represents positive current, and causes the integrator 2y/2z to decrease the potential level of the bias signal BS, and the direct bias current to the metal-semiconductor type field effect transistor 3a is decreased. The reduction of the direct bias current gives rise to increase the distortion, and the ratio VA/VB is decreased.

On the other hand, if VA/VB is less than RA/RB, IS represents negative current, and the integrator 2y/2z raises the potential level of the bias signal BS. Then, the bias current generator 2u increases the direct bias current supplied to the metal-semiconductor type field effect transistor 3a. The increase of the direct bias current gives rise to decrease of the distortion, and the ratio VA/VB becomes larger.

Finally, the circuit behavior is simply described. The high-frequency power amplifier 3 is producing the output signal OUT2 from the input signal IN2 under a certain direct bias current. The output signal OUT2 is supplied through the directional coupler 2 to the load 4, and the directional coupler 2a generates the branched signal BR1 from the output signal OUT2. The branched signal BR1 passes through the coupler 2b, and is separated into the positive half-wave and the negative half-wave.

The positive half-wave is accumulated into the smoothing condenser 2n, and the operational amplifier 2o supplies the output signal OUT4 representative of the positive peak value of the branched signal BR1 and, accordingly, the output signal OUT2 to the resistor 2v. Similarly, the negative half-wave is accumulated into the smoothing condenser 2r, and the operational amplifier 2s supplies the output signal OUT5 representative of the negative peak value of the output signal OUT2 to the resistor 2w. The mixer 2t varies the current IS depending upon the ratio VA/VB, and cooperates with the bias current generator 2u so as to regulate the bias signal BS in such a manner that the ratio VA/VB is matched with a target value representative of the target distortion level.

As will be understood from the foregoing description, the bias current controlling circuit 2 determines the ratio between the positive peak value VA and the negative peak value VB, and varies the direct bias current in such a manner as to match the ratio VA/VB with the ratio RA/RB. For this reason, if the ratio RA/RB is adjusted to a target ratio between the positive peak value VA and the negative value VB corresponding to the target distortion level or a target magnitude of the distortion, the distortion of the output signal OUT2 is automatically regulated to the target level. Although the output signal OUT2 contains a relatively large distortion, the fidelity is acceptable, and the high-frequency power amplifier 3 drastically decreases the electric power consumption.

Although a particular embodiment of the present invention has been shown and described, it will be obvious to those skilled in the art that various changes and modifications may be made without departing from the spirit and scope of the present invention.

For example, the bias controlling circuit is never limited to the transmitting section of the portable telephone, and is available for any kind of electric circuit in so far as the power conservation and the fidelity are important technical goals.

The magnitude of the distortion may be represented by a certain arithmetic operation between the positive and negative values such as, for example, a difference between the positive peak value and the negative peak value.

What is claimed is:

1. A bias current controlling circuit for an amplifier comprising:
   a distortion detecting means for producing a first output signal representative of the magnitude of a distortion contained in a second output signal of said amplifier; and
   a bias current regulating means responsive to said first output signal to regulate a bias current supplied to said amplifier to match said magnitude of said distortion with a target magnitude, wherein said bias current regulating means comprises an operational amplifier receiving an input comprising a positive half-wave signal of said amplifier and a negative half-wave signal of said amplifier.

2. The bias current controlling circuit as set forth in claim 1, in which said amplifier has a transistor, and said bias current is supplied to a control node of said transistor.

3. The bias current controlling circuit as set forth in claim 2, in which said transistor is a field effect transistor having a conductive channel formed of a compound semiconductor material, and said bias current is supplied through a choke coil to a gate electrode of said field effect transistor serving as said control node.

4. The bias current controlling circuit as set forth in claim 1, in which said bias current controlling circuit forms a part of a transmitting section of a radio communication device.

5. The bias current controlling circuit as set forth in claim 4, in which said radio communication device is a battery powered portable telephone.

6. A bias current controlling circuit for an amplifier comprising:
- a distortion detecting means for producing a first output signal representative of the magnitude of distortion contained in an amplifier output signal of said amplifier, wherein said distortion detecting means comprises;
- a first detector for determining a positive peak value of said amplifier output signal,
- a second detector for determining a negative peak value of said amplifier output signal, said positive peak value and said negative peak value being representative of said magnitude of said distortion, and
- a bias current regulating means responsive to said first output signal to regulate a bias current supplied to said amplifier to match said magnitude of said distortion with a target magnitude.

7. The bias current controlling circuit as set forth in claim 6, in which a ratio between said positive peak value and said negative peak value represents said magnitude of said distortion.

8. The bias current controlling circuit as set forth in claim 6, in which said distortion detecting means further comprises;
- a directional coupler connected to said amplifier for generating a coupler output signal proportional to said amplifier output signal, and
- a coupler having a coupling condenser connected between said directional coupler and said first and second detectors to distribute said coupler output signal to said first and second detectors.

9. The bias current controlling circuit as set forth in claim 8, wherein said first detector comprises;
- a first detecting diode having an anode connected to said coupler, a first resistor connected to a cathode of said first detecting diode, a first smoothing condenser connected between said first resistor and a constant potential source, and a first operational amplifier having a first non-inverted node connected to said first smoothing condenser and a first inverted node connected to an output node thereof, and said second detector comprising;
- a second detecting diode having a cathode connected to said coupler, a second resistor connected to an anode of said second detecting diode, a second smoothing condenser connected between said second resistor and said constant potential source, and a second operational amplifier having a second non-inverted node connected to said second smoothing condenser and a second inverted node connected to an output node thereof, wherein
- a first detector output signal of said first operational amplifier and a second detector output signal of said second operational amplifier serve as said first output signal.

10. A bias current controlling circuit for an amplifier comprising:
- a distortion detecting means for producing a first output signal representative of a magnitude of distortion contained in an amplifier output signal of said amplifier; and
- a bias current regulating means responsive to said first output signal to regulate a bias current supplied to said amplifier to match said magnitude of said distortion with a target magnitude, wherein said bias current regulating means comprises;
  - a mixer connected to said distortion detecting means for producing a mixer output signal representative of a decrease of said bias current or an increase of said bias current from said first output signal, and
  - an integrator connected to said mixer and responsive to said mixer output signal for varying said bias current.

11. A bias current controlling circuit for an amplifier comprising:
- a distortion detecting means for producing a first output signal representative of a magnitude of distortion contained in an amplifier output signal of said amplifier, wherein said distortion detecting means comprises;
  - a first detector for determining a positive peak value of said amplifier output signal to produce a positive output signal having a first potential level representative of said positive peak value, and
  - a second detector for determining a negative peak value of said amplifier output signal to produce a negative output signal having a second potential level representative of said negative peak value, said positive and negative output signals serving as said first output signal; and
- a bias current regulating means responsive to said first output signal to regulate a bias current supplied to said amplifier to match said magnitude of said distortion with a target magnitude, wherein said bias current regulating means comprises;
  - a mixer comprising a first resistor connected at one end thereof to said first detector and a second resistor connected at one end thereof to said second detector and at the other end thereof to the other end of said first resistor and operative to mix said positive output signal with said negative output signal at said other ends of said first and second resistors for generating a mixer output signal representative of a decrease of said bias current or an increase of said bias current, said first resistor and said second resistor having respective resistances adjusted to a predetermined ratio representative of said target magnitude, and
  - an integrator connected to said mixer and responsive to said mixer output signal for regulating said bias current.

12. The bias current controlling circuit as set forth in claim 11, in which said integrator comprises an operational amplifier having an inverted node connected to said mixer and a non-inverted node connected to a constant potential source, and an integrating condenser connected between said inverted node and an output node of said operational amplifier.

* * * * *